United States Patent
Kawanabe et al.

(10) Patent No.: US 12,550,231 B2
(45) Date of Patent: Feb. 10, 2026

(54) CERAMIC STRUCTURE AND METHOD MANUFACTURING CERAMIC STRUCTURE

(71) Applicant: KYOCERA Corporation, Kyoto (JP)

(72) Inventors: Yasunori Kawanabe, Kirishima (JP); Yuusaku Ishimine, Aira (JP); Takeshi Muneishi, Kusatsu (JP); Yoshihiro Okawa, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 1193 days.

(21) Appl. No.: 17/292,246

(22) PCT Filed: Nov. 20, 2019

(86) PCT No.: PCT/JP2019/045380
§ 371 (c)(1),
(2) Date: May 7, 2021

(87) PCT Pub. No.: WO2020/110850
PCT Pub. Date: Jun. 4, 2020

(65) Prior Publication Data
US 2022/0007466 A1    Jan. 6, 2022

(30) Foreign Application Priority Data
Nov. 30, 2018    (JP) .................. 2018-224680

(51) Int. Cl.
*H05B 3/74*    (2006.01)
*B28B 1/00*    (2006.01)
(Continued)

(52) U.S. Cl.
CPC ............. *H05B 3/74* (2013.01); *B28B 1/002* (2013.01); *B28B 11/243* (2013.01); *H05B 3/06* (2013.01);
(Continued)

(58) Field of Classification Search
CPC ...... H05B 3/74; H05B 3/06; H05B 2203/016; H05B 2203/017; B28B 1/002; B28B 11/243
(Continued)

(56) References Cited

U.S. PATENT DOCUMENTS 7,714,235 B1 *    5/2010   Pedersen ............ G01R 1/06727
                                                            174/267
10,433,433 B2 *   10/2019  Nasu .................. G01R 1/07307
(Continued)

FOREIGN PATENT DOCUMENTS

JP    2002-141404 A    5/2002
JP    2003-40686 A     2/2003
(Continued)

*Primary Examiner* — Helena Kosanovic
*Assistant Examiner* — Yeong Juen Thong
(74) *Attorney, Agent, or Firm* — Procopio, Cory, Hargreaves & Savitch LLP

(57) ABSTRACT

A heater includes a base body and an internal conductor. The base body is made of ceramic. The internal conductor is located inside the base body and includes a connection portion. The base body includes a space extending from the connection portion to a lower surface of the base body. The space includes a first space and a second space. The first space contacts with the connection portion. The second space connects the first space and an outer side of the lower surface of the base body, and is smaller than the first space in a planar perspective of the lower surface of the base body.

6 Claims, 10 Drawing Sheets

(51) Int. Cl.
 *B28B 11/24* (2006.01)
 *H05B 3/06* (2006.01)
(52) U.S. Cl.
 CPC .. *H05B 2203/016* (2013.01); *H05B 2203/017* (2013.01)
(58) Field of Classification Search
 USPC ................................ 219/444.1, 441; 432/24
 See application file for complete search history.

(56) References Cited

U.S. PATENT DOCUMENTS

| | | | |
|---|---|---|---|
| 10,515,836 B2* | 12/2019 | Tsuchida | H01L 21/6833 |
| 2004/0196614 A1* | 10/2004 | Miyaji | H01L 21/6831 |
| | | | 361/234 |
| 2018/0033668 A1* | 2/2018 | Tsuchida | H01L 21/6833 |

FOREIGN PATENT DOCUMENTS

| | | |
|---|---|---|
| JP | 2012-49185 A | 3/2012 |
| JP | 2018-16536 A | 2/2018 |

\* cited by examiner

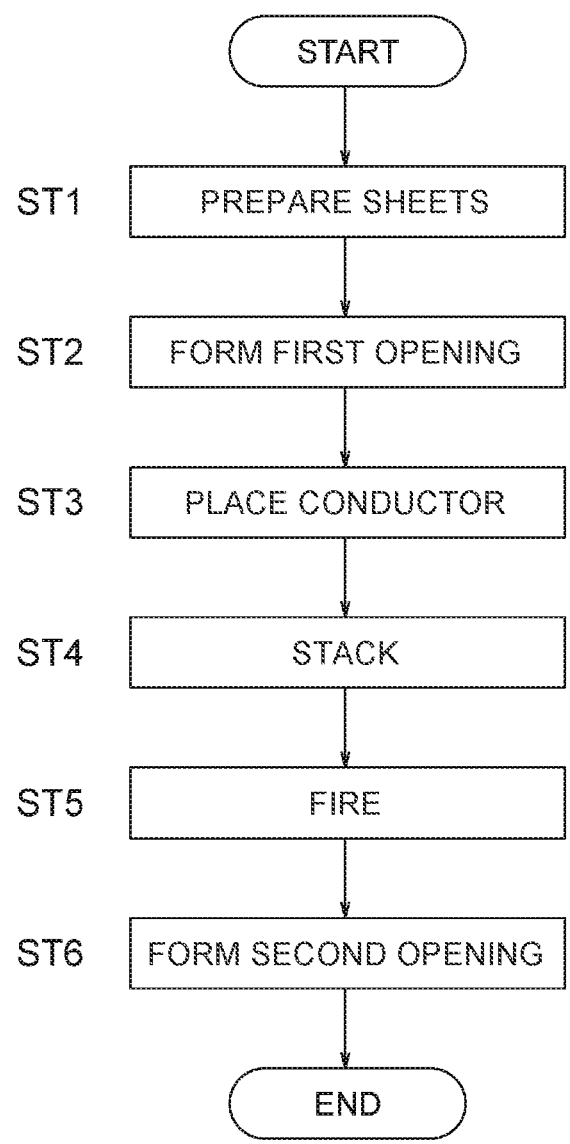

CERAMIC STRUCTURE AND METHOD MANUFACTURING CERAMIC STRUCTURE

TECHNICAL FIELD

The present disclosure relates to a ceramic structure and a method for manufacturing the same.

BACKGROUND ART

Known in the art is a ceramic structure using ceramic as a base body. As the ceramic structure, for example, there can be mentioned a ceramic heater, electrostatic chuck, and plasma generation-use electrode member each utilized for processing a wafer. These ceramic structures have internal conductors inside the base bodies. Portions of the internal conductors are exposed to external portions of the base bodies for connection with terminals. In Patent Literatures 1 to 3, holes are formed in the base body by machining or the like to as to expose portions of the internal conductor to the external portion of the base body. The holes are made shapes and sizes in the transversal cross-sections perpendicular to the depth direction which are made constant in the depth direction or are made taper-shaped so as to become larger in diameter the closer to the external portion of the base body.

CITATION LIST

Patent Literature

Patent Literature 1: Japanese Patent Publication No. 2012-49185
Patent Literature 2: Japanese Patent Publication No. 2003-40686
Patent Literature 3: Japanese Patent Publication No. 2002-141404

SUMMARY OF INVENTION

A ceramic structure according to an aspect of the present disclosure includes a base body and an internal conductor. The base body is made of ceramic and includes a first surface. The internal conductor is located inside the base body and includes a connection portion. The base body includes a space extending from the connection portion to the first surface. The space includes a first space and second space. The first space is in contact with the connection portion. The second space connects the first space and an outer side of the first surface and, in a planar perspective of the first surface, is smaller than the first space.

A ceramic structure according to an aspect of the present disclosure includes a base body and an internal conductor. The base body is made of ceramic and includes a first surface. The internal conductor is located inside the base body and includes a connection portion. The base body includes a space extending from the connection portion to the first surface. The internal conductor includes a conductor layer which extends along the first surface over the space and its outer side. The conductor layer flexes in a part overlapping the space to a side closer to the first surface.

A ceramic structure according to an aspect of the present disclosure includes a base body and an internal conductor. The base body is made of ceramic and includes a first surface. The internal conductor is located inside the base body and includes a connection portion. The base body includes a space extending from the connection portion to the first surface. A wall surface of the space includes a first region and second region. The second region is located on a side closer to the first surface relative to the first region and includes a condition of a surface different from that of the first region.

A method manufacturing any of the above ceramic structures, according to an aspect of the present disclosure, includes a preparation step, conductor placement step, first opening forming step, stacking step, firing step, and second opening forming step. In the preparation step, one or more of each of a first to third ceramic green sheet are prepared. The first ceramic green sheet configures a first portion in the base body which contacts the internal conductor on an opposite side to the first surface. The second ceramic green sheet configures a second portion in the base body which contacts the internal conductor on a side closer to the first surface. The third ceramic green sheet configures a third portion in the base body which contacts the second portion on the side closer to the first surface and includes the first surface. In the conductor placement step, a material forming the internal conductor is placed on the side closer to the first surface with respect to the first ceramic green sheet. In the first opening forming step, a first opening which becomes a portion on a side closer to the internal conductor in the space is formed in the second ceramic green sheet. In the stacking step, the first to third ceramic green sheets are stacked after the conductor placement step and the first opening forming step to thereby obtain a stacked assembly. In the firing step, the stacked assembly is fired. In the second opening forming step, a second opening which becomes a portion on the side closer to the first surface in the space is formed in a region overlapping the first opening in the third portion in the stacked assembly after firing.

BRIEF DESCRIPTION OF DRAWINGS

FIG. 4 is a flow chart showing an example of the procedure in a method for manufacturing the heater in FIG. 1.

DESCRIPTION OF EMBODIMENTS

Figure 1:
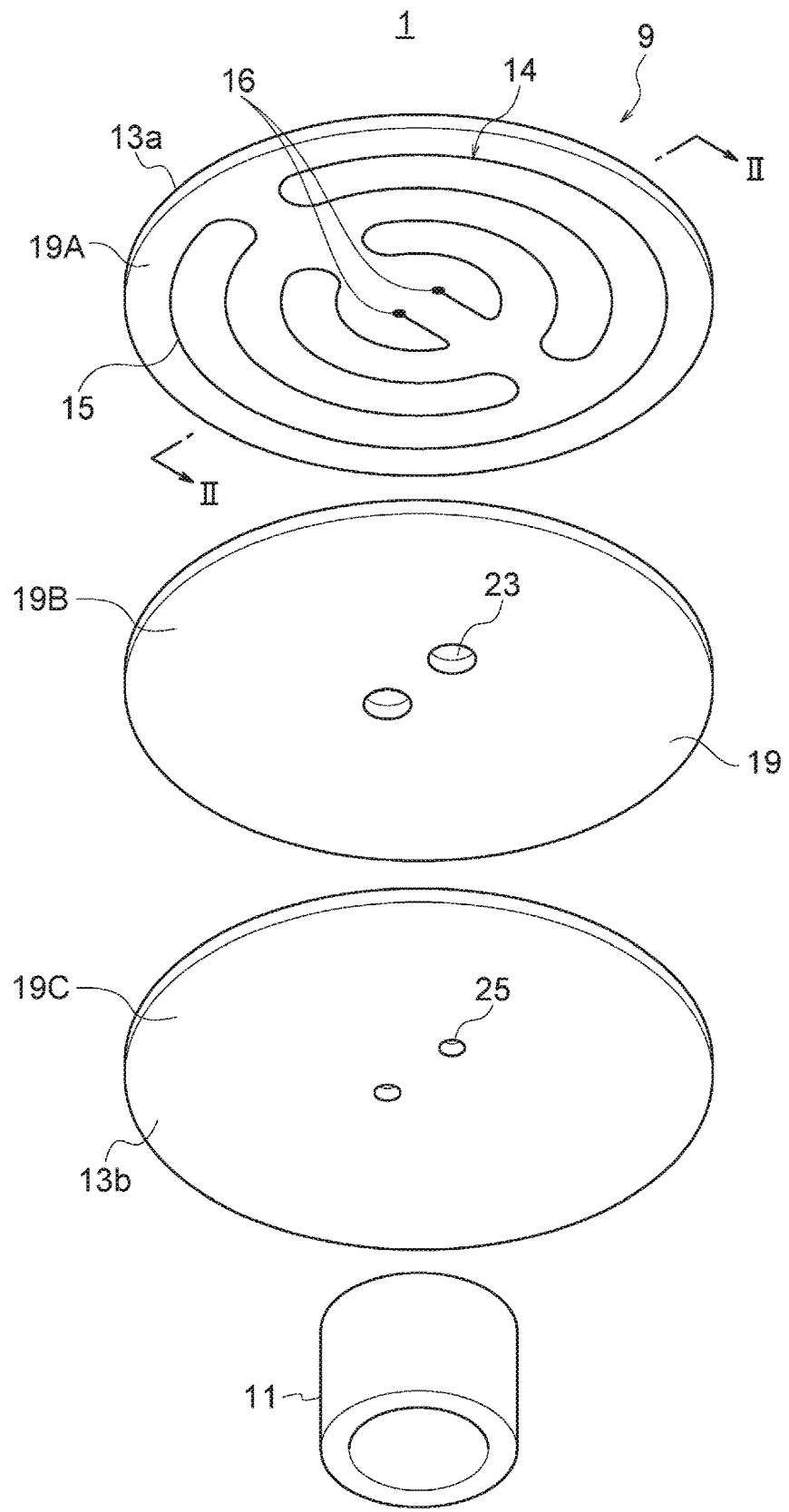
FIG. 1 is a schematic disassembled perspective view showing the configuration of a heater according to an embodiment.

Below, a ceramic structure in the present disclosure will be explained by taking a ceramic heater as an example. The drawings referred to in the following explanations are schematic ones for convenience of explanation. Accordingly, sometimes details will be omitted. Further, the size ratios will not always coincide with the actual ones. Further, the heater may be further provided with known components which are not shown in the drawings.

(Heater System)

Figure 2:
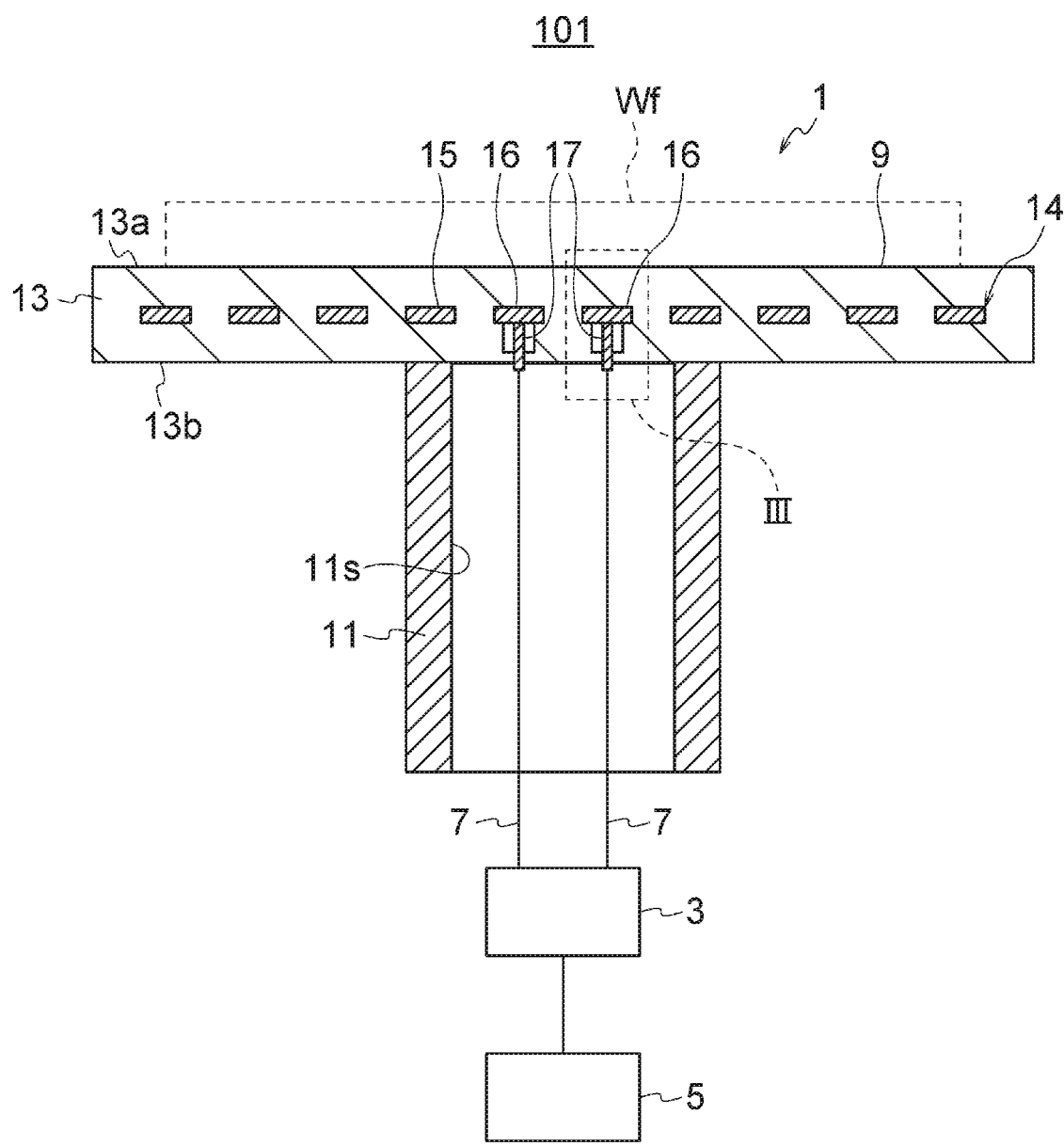
FIG. 2 is a cross-sectional view taken along the II-II line in FIG. 1.

FIG. 1 is a schematic disassembled perspective view showing the configuration of a heater 1 according to an embodiment. FIG. 2 is a schematic view showing the configuration of a heater system 101 including the heater 1 in FIG. 1. In FIG. 2, for the heater 1, a cross-sectional view along the II-II line in FIG. 1 is shown. FIG. 1 shows the heater 1 in a disassembled manner for convenience in order to show the structure of the heater 1. An actual heater 1 after completion need not be able to be disassembled as in the disassembled perspective view in FIG. 1.

The upper parts in the drawing sheets of FIG. 1 and FIG. 2 are for example vertically upward. However, the heater 1 need not be utilized assuming the upper parts in the drawing sheets of FIG. 1 and FIG. 2 are vertically upper parts. In the following explanation, for convenience, sometimes the "upper surface" and "lower surface" and other terms will be used where the upper parts in the drawing sheets of FIG. 1 and FIG. 2 are the vertically upper parts. When simply referred to as "when viewed on a plane", unless particularly explained otherwise, it designates "viewed from the upper parts in the drawing sheets of FIG. 1 and FIG. 2".

The heater system 101 has the heater 1, a power supply part 3 (FIG. 2) which supplies power to the heater 1, and a control part 5 (FIG. 2) which controls the power supply part 3. The heater 1 and the power supply part 3 are connected by wiring members 7 (FIG. 2). Note that, the wiring members 7 may be grasped as portions of the heater 1. Further, the heater system 101, other than the configurations explained above, for example, may have a fluid supply part which supplies gas and/or liquid to the heater 1.

(Heater)

The heater 1 for example has a substantially plate-shaped (disk-shaped in the example shown) heater plate 9 and a pipe 11 which extends downward from the heater plate 9.

The heater plate 9 has a wafer Wf (FIG. 2) placed (superposed) on its upper surface 13a as one example of a heated object and directly contributes to heating of the wafer. The pipe 11 for example contributes to support of the heater plate 9 and protection of the wiring members 7. Note that, the heater plate 9 alone may be grasped as the heater as well.

(Heater Plate)

The upper surface 13a and lower surface 13b of the heater plate 9 are for example substantially flat. The planar shape and various dimensions of the heater plate 9 may be suitably set considering the shape and dimensions etc. of the heated object. For example, the planar shape is circular (example shown) or polygonal (for example rectangular). When showing one example of dimensions, the diameter is 20 cm to 35 cm, and the thickness is 4 mm to 30 mm. Note that, in the explanation of the present embodiment, "rectangular" or other terms concerned with the polygonal shape may include a shape with corner portions chamfered by straight lines (planes) or curves (curved surfaces) unless particularly explained otherwise.

The heater plate 9 is for example provided with an insulating base body 13 (notation is shown in FIG. 2), an internal conductor 14 buried in the base body 13, and terminals 17 (FIG. 2) electrically connected with the internal conductor 14. The internal conductor 14 includes a resistance heating element 15 and connection portions 16 which are connected to the terminals 17. By flow of current in the resistance heating element 15, heat is generated according to Joule's law, and in turn the wafer Wf placed on the upper surface 13a of the base body 13 is heated.

(Base Body)

The outer shape of the base body 13 forms the outer shape of the heater plate 9. Accordingly, the explanation relating to the shape and dimensions of the heater plate 9 explained above may be grasped as an explanation of the outer shape and dimensions of the base body 13 as it is. The material of the base body 13 is for example ceramic. The ceramic is for example a sintered body containing aluminum nitride (AlN), aluminum oxide ($Al_2O_3$, alumina), silicon carbide (SiC) silicon nitride ($Si_3N_4$) or the like as the principal ingredient. Note that, the principal ingredient is for example an ingredient accounting for 50 mass % or more or 80 mass % or more of the material (same is true for the other members and other materials unless particularly explained otherwise).

As shown in FIG. 1, the base body 13 is for example configured by a first insulation layer 19A, second insulation layer 19B, and third insulation layer 19C (below, sometimes they will be simply referred to the "insulation layers 19" and will not be differentiated) stacked on each other. The first insulation layer 19A configures a part from the resistance heating element 15 up to the upper surface 13a. The second insulation layer 19B configures a portion on the internal conductor 14 side in the part from the resistance heating element 15 up to the lower surface 13b. The third insulation layer 19C configures a part from the second insulation layer 19B up to the lower surface 13b.

The materials of the plurality of insulation layers 19 are the material of the base body 13 explained above. Further, the materials of the insulation layers 19 may be the same as each other or may be different from each other. The boundary of the two or more insulation layers 19 need not be able to be identified from the viewpoint of the materials. Each insulation layer 19 may be configured by a further thinner plurality of insulation layers stacked on each other.

(Resistance Heating Element)

The resistance heating element 15 runs along (for example in parallel) the upper surface 13a and the lower surface 13b in the base body 13. Further, the resistance heating element 15, when viewed on a plane, for example, extends covering over substantially the entire surface of the base body 13.

The specific pattern (route) of the resistance heating element 15 when viewed on a plane may be made a suitable one. For example, only one resistance heating element 15 is provided in the heater plate 9 and extends from one end to the other end without crossing itself. Further, in the example shown, the resistance heating element 15, in each of the regions obtained by dividing the heater plate 9 into two, extends so as to weave back and forth (meander) in a circumferential direction. Other than this, for example, the resistance heating element 15 may spirally extend or may extend so as to linearly weave back and forth in one radial direction.

The shape when locally viewing the resistance heating element 15 may be made a suitable one. For example, the resistance heating element 15 may be a layered conductor which is parallel to the upper surface 13a and lower surface 13b, may be coil shaped (spring shaped) wound using the above route as the axis, or may be formed in a mesh shape. Also, the dimensions in the various shapes may be suitably set.

The material of the resistance heating element 15 is a conductor (for example metal) which generates heat by flow of current. That is, it is a conductor having a relatively high resistance value. The conductor may be suitably selected. For example, it is tungsten (W), molybdenum (Mo), platinum (Pt), indium (In), or an alloy containing them as principal constituents. Further, the material of the resistance heating element 15 may be one obtained by firing a conductive paste including the metal as described before. That is, the material of the resistance heating element 15 may be one containing glass powder and/or ceramic powder (from another viewpoint, an inorganic insulation substance).

(Connection Portions)

The connection portions 16 may be configured by portions of the resistance heating element 15. Otherwise, they may be configured as different portions from the resistance heating element 15 and interposed between the resistance heating element 15 and the terminals 17. Further, from another viewpoint, the materials, widths, and/or thicknesses of the connection portions 16 may be the same as or may be different from the material, width, and/or thickness of the resistance heating element 15.

In FIG. 1, for convenience, the entirety or majority of the resistance heating element 15 is abstractly drawn by lines, and the connection portions 16 are drawn by black dots having larger diameters than the widths of the lines. FIG. 2 shows the resistance heating element 15 configured by a layered conductor and schematically shows an example in which the connection portions 16 are configured by portions of the layered conductor. In a case where the materials of the connection portions 16 are materials different from the material of the resistance heating element 15, the materials of the connection portions 16 may be ones able to be utilized or may be ones unable to be utilized as the material of the resistance heating element 15. Further, they may be ones obtained by firing a conductive paste.

In the explanation of the present embodiment, for convenience, a case where the connection portions 16 are portions of the resistance heating element 15 will be taken as an example.

The connection portions 16 are for example positioned at the two ends of the resistance heating element 15 in the long direction. A pair of the connection portions 16 are provided. The pair of connection portions 16 (two ends of the resistance heating element 15) are for example positioned at the center side of the heater plate 9. Note that, three or more connection portions 16 (terminals 17) may be provided for one resistance heating element 15, or two or more sets of connection portions 16 (terminals 17) which supply power to two or more (for example two or more layers of) resistance heating elements 15 may be provided as well.

(Terminals)

The same number of terminals 17, for example, as the number of the connection portions 16 are provided and are joined to the connection portions 16. Portions of the terminals 17 are exposed from the lower surface 13b of the base body 13 to an external portion of the base body 13. Due to this, it becomes possible to supply power from the external portion of the heater plate 9 to the resistance heating element 15 through the terminals 17 and connection portions 16. The terminals 17 are for example configured by members having conductivity on at least the surfaces. For example, the terminals 17 are configured in their entireties by bulk materials (metal members) made of metal. The shapes of the terminals 17 may be made suitable ones. For example, they are substantially column-shaped (shaft-shaped). The shapes of transversal cross-sections perpendicular to the shafts may be made circular shapes or other suitable shapes. In the terminal 17, any of the length in the axial direction (up/down direction) and diameter may be larger as well.

(Pipe)

The pipe 11 is hollow shape opened at the top and bottom (two sides in the axial direction). From another viewpoint, the pipe 11 has a space 11s running through it from the top to bottom. The shapes of a transversal cross-section (cross-section perpendicular to the axial direction) and vertical cross-section (cross-section parallel to the axial direction, the cross-section shown in FIG. 2) in the pipe 11 may be suitably set. In the example shown, the pipe 11 is cylinder shaped with a constant diameter relative to the position in the axial direction. Naturally, the pipe 11 may differ in diameter according to the position in the height direction. Further, specific values of dimensions of the pipe 11 may be suitably set. Although not particularly shown, in the pipe 11, a channel in which gas or liquid flows may be formed.

The pipe 11 may be configured by ceramic or another insulation material or may be configured by a metal (conductive material). As specific materials of the ceramic, for example, ones (AlN etc.) given in the explanation of the base body 13 may be utilized. Further, the material of the pipe 11 may be the same as the material of the base body 13 or may be different from the latter.

The base body 13 and the pipe 11 may be fixed together out by a suitable method. For example, the two may be fixed together by an adhesive (not shown) interposed between the two, may be fixed together by solid phase bonding without an adhesive interposed between the two, or may be mechanically fixed together by utilizing bolts and nuts (both not shown).

(Wiring Members)

The wiring members 7 are inserted in the space 11s in the pipe 11. The plurality of terminal parts 17 are exposed from the base body 13 in a region in the heater plate 9 which is exposed to the space 11s in a planar perspective. Further, the wiring members 7 are connected at single ends to the plurality of terminal parts 17.

The plurality of wiring members 7 may be flexible electrical wires, may be rod-shaped ones without flexibility, or may be a combination of the same. Further, the plurality of flexible electrical wires may be bundled together so as to become like one cable or need not be bundled together.

Further, the connections between the wiring members 7 and the terminal parts 17 may be suitable ones. For example, the two may be joined by a conductive bonding material. Further, for example, the two may be screwed together by forming a male screw in one and forming a female screw in the other. The terminal parts 17 may have specific shapes for connection with the wiring members 7 like the screws explained before. In the following explanation, however, illustration of such specific shapes will be basically omitted.

(Structure of Surroundings of Connection Portions)

Figure 3:
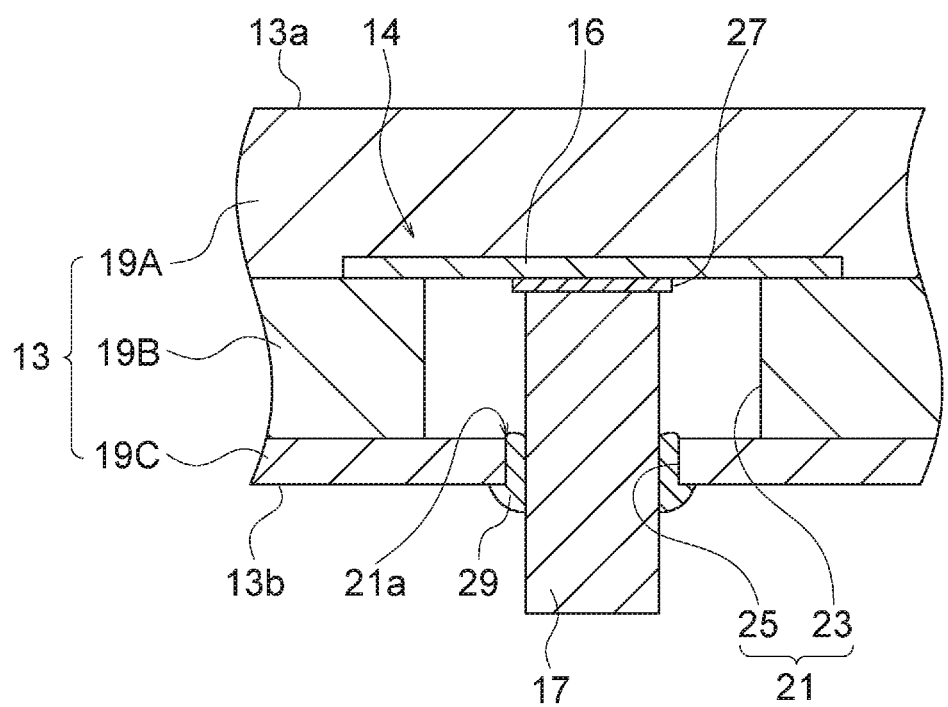
FIG. 3 is an enlarged view of a region III in FIG. 2.

FIG. 3 is an enlarged view of a region III in FIG. 2.

The base body 13 has spaces 21 for exposing the connection portions 16 to the external portion of the base body 13 for making it possible to connect the connection portions 16 and the terminals 17. In the spaces 21, the terminals 17 are arranged. The terminals 17 are connected with the connection portions 16 and are exposed from the lower surface 13b of the base body 13 to the external portion of the base body 13.

In the example shown, the majority of the spaces 21 are made empty states (vacuum states or states where there is a gas). However, a predetermined material (for example sealing material or bonding material) may be filled in the spaces 21 in the manufacturing process of the heater 1. That is, after completion of the heater, it is sufficient that material configuring the base body 13 not be positioned inside the spaces 21. The spaces 21 need not be empty states. Whether portions in the base body 13 filled with a predetermined material are the spaces 21 may be reasonably judged from the type of the material, the volume of the material, the shapes of the portions filled with the material, the manufacturing process, and the like.

Each space 21 has a first space 23 (see FIG. 1 as well) configured by a through-hole passing through the second insulation layer 19B and a second space 25 (see FIG. 1 as well) configured by a through-hole passing through the third insulation layer 19C. In other words, the space 21 has the first space 23 contacting the connection portion and the second space 25 connecting the first space 23 and the outer side of the lower surface 13b of the base body 13.

The shapes and dimensions of the first space 23 and second space 25 may be suitably set. For example, the shape of the transversal cross-section of the first space 23 and/or second space 25 parallel to the lower surface 13b of the base body 13 may be made circular (example shown), elliptical, rectangular, polygonal other than rectangular, or other suitable shapes. Further, for example, the shape of the vertical cross-section of the first space 23 and/or second space 25 perpendicular to the lower surface 13b of the base body 13 may be made rectangular (example shown), trapezoidal so as to increase in diameter the more to the lower surface 13b side, trapezoidal so as to decrease in diameter the more to the lower surface 13b side, or a shape partially including a curve (curved surface).

In a planar perspective of the lower surface 13b, one of the first space 23 and second space 25 may fall into the other or the two may coincide with each other. In the example shown, in a planar perspective of the lower surface 13b, the second space 25 is smaller than the first space 23 and falls into the first space 23. In turn, on the inner wall surface of the space 21, a step 21a is configured at the boundary between the first space 23 and the second space 25. From another viewpoint, the second space 25 opens in a portion of the surface of the first space 23 on the lower surface 13b side. The degree of difference of sizes of the two may be suitably set. For example, the difference of sizes of the two may be a degree somewhat larger than a machining error.

Any of the sizes of the first space 23 and the second space 25 in the direction (vertical direction) perpendicular to the lower surface 13b of the base body 13 (thicknesses of the second insulation layer 19B and the third insulation layer 19C) may be larger than the other. In the example shown, the size of the second space 25 in the vertical direction is smaller than the size of the first space 23 in the vertical direction. The degree of difference of the sizes may be suitably set. For example, the size of the second space 25 in the vertical direction may be made ½ or less or ⅓ or less relative to the size of the first space 23 in the vertical direction.

The relative size of the space 21 with respect to the connection portion 16 etc. may also be suitably set. In the example shown, a space 21 (each of first space 23 and second space 25) is for example provided for each connection portion 16. That is, the first space 23 contacts only one connection portion 16 and does not overlap two or more connection portions 16. Further, in a planar perspective of the lower surface 13b of the base body 13, the first space 23 may fall in the connection portion 16 (example shown), may coincide with the connection portion 16, or may extend to the outer side from the connection portion 16.

Each space 21, for example, as already explained, is mostly (for example 80% or more) made an empty state. The space 21 in this empty state may be sealed or may not be sealed. In the example shown, the space 21 is sealed by provision of a sealing material 29 which is interposed between the terminal 17 and the base body 13. In the sealed space 21, gas may be sealed or the space may be made a vacuum. The sealed gas may be made for example nitrogen or another inert gas. The "vacuum" is actually a state where the pressure is reduced more than the atmospheric pressure. Due to this, the connection portion 16 etc. can be protected from oxidation. Note that, when the space 21 is not sealed, the space 21, for example, contains the gas of the surroundings of the base body 13.

The material of the sealing material 29 may be made a suitable one. For example, it may be a material used for general glass sealing, or a $CaO$—$Al_2O_3$—$Y_2O_3$ or other bonding agent may be used. The sealing material 29 is for example filled in substantially the entirety of the second space 25. However, the sealing material 29 may be arranged so that at least a portion in the second space 25 is made empty as well. Conversely, the sealing material 29 may be positioned also in the first space 23 with a relatively large volume. Further, it may be filled in the first space 23 as well.

A terminal 17 is arranged in the space 21 and is joined at one end with the connection portion 16. The end part of the terminal 17 on the side opposite to the end part connected to the connection portion 16 may be positioned on the outer side from the lower surface 13b of the base body 13 (example shown), may be positioned in the second space 25, or may be positioned in the first space 23. In the terminal 17, at least the portion on the side closer to the connection portion 16 than the lower surface 13b is made a size small enough to pass through the second space 25. Although not particularly shown, the terminal 17 may have a flange which faces (engaged with) the lower surface 13b at the periphery of the second space 25.

The terminal 17 and the connection portion 16 may be connected by a suitable method. In the example shown, the two are joined by a conductive bonding material 27. The bonding material 27 may be made for example an Ag—Cu—Ti alloy (alloy containing Ag, Cu, and Ti) or another brazing material. Note that, in the heater 1 after completion, differentiation of the bonding material 27 and the connection portion 16 may be impossible. In this case, the bonding material 27 may be for example grasped as a portion of the connection portion 16. Although not particularly shown, the terminal 17 may only abut against the connection portion 16 as well.

(Manufacturing Method of Heater Plate)

Figure 5A:
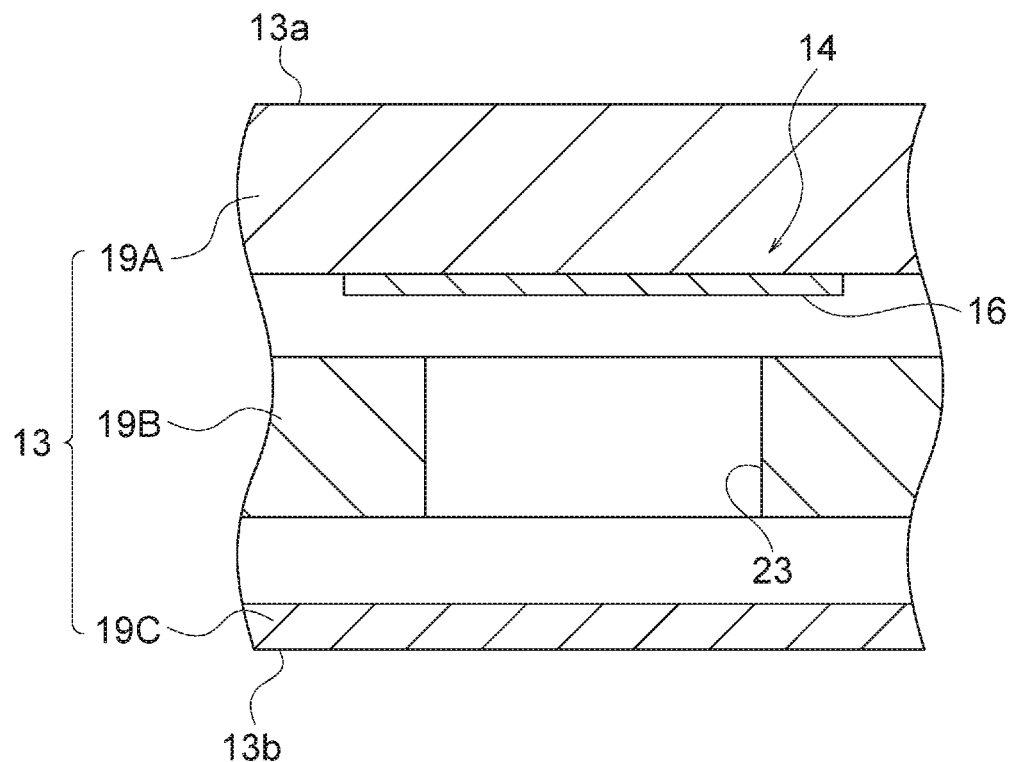
FIG. 5A and FIG. 5B are cross-sectional views showing portions of the heater in the middle of manufacturing.
Figure 5B:
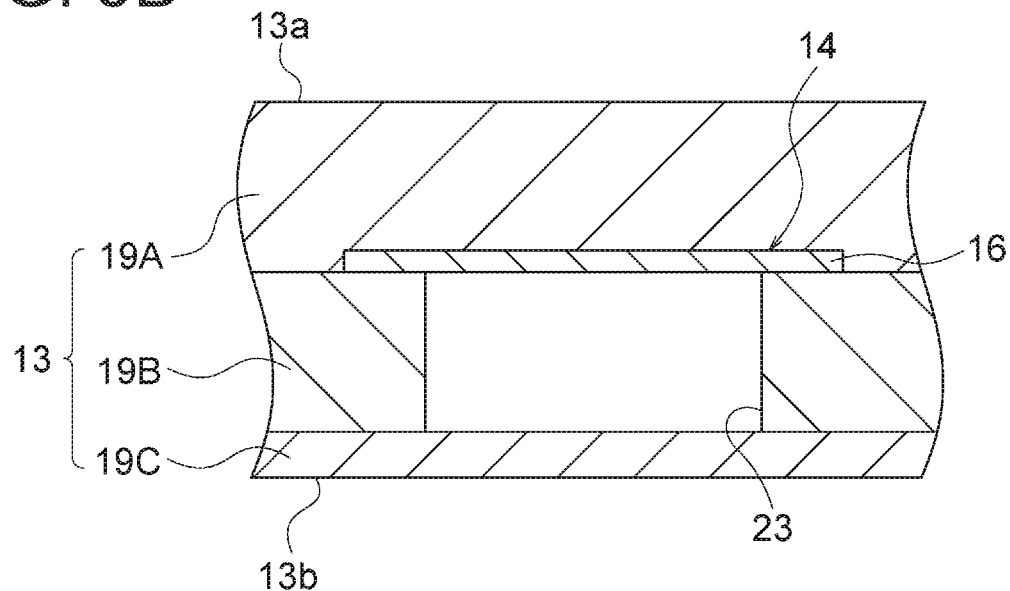
Figure 6A:
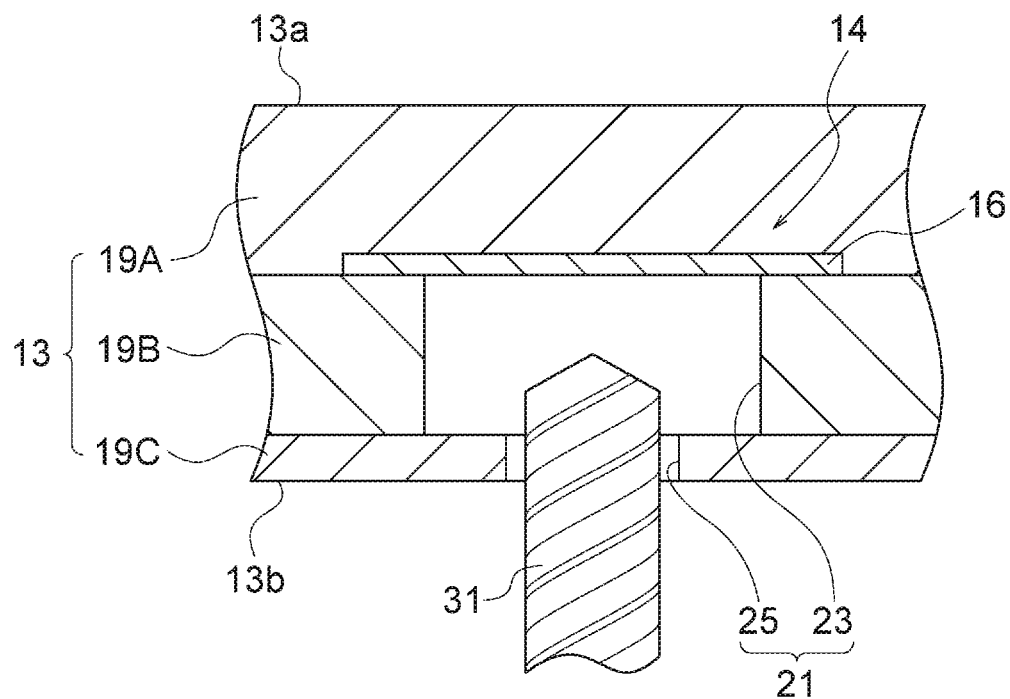
FIG. 6A is a cross-sectional view showing a portion in the heater in the middle of manufacturing.

FIG. 4 is a flow chart showing an example of the procedure in a method for manufacturing the heater plate 9. Further, FIG. 5A, FIG. 5B, and FIG. 6A are cross-sectional views corresponding to FIG. 3 and show portions in the heater plate 9 in the middle of manufacturing. The materials and shapes etc. of the members change along with the progress in the manufacturing process. However, for convenience of explanation, use is made of the same notations before and after the change of the materials and shapes and the like.

At step ST1, the first insulation layer 19A to third insulation layer 19C (ceramic green sheets) before firing are prepared (see FIG. 5A).

At step ST2, through-holes (first openings) forming the first spaces 23 are formed in the second insulation layer 19B (ceramic green sheet) before firing (see FIG. 5A). The method of formation of the through-holes may be made the same as various known methods. For example, use may be made of punching, cutting, and/or laser. The cutting tool used in the machining may be made a suitable one. For example, use may be made of a drill.

At step ST3, a conductive paste for forming the internal conductor 14 is placed at the first insulation layer 19A to third insulation layer 19C (ceramic green sheets) before firing (see FIG. 5A). Specifically, for example, a conductive paste for forming the resistance heating element 15 including the connection portions 16 is placed at the second insulation layer 19B side of the first insulation layer 19A. Note that, step ST2 and step ST3 may be reversed in order as well.

At step ST4, the first insulation layer 19A to third insulation layer 19C before firing are stacked to obtain a base body 13 before firing (stacked assembly of ceramic green sheets, see FIG. 5B). The second spaces 25 are not yet formed in the third insulation layer 19C, therefore the first spaces 23 are closed and sealed by the third insulation layer 19C. The sealed first spaces 23 may be rendered a vacuum or gas may be sealed in them. The gas may be made for example nitrogen or another inert gas. Further, after the first insulation layer 19A to third insulation layer 19C are stacked, degreasing may be carried out as well. Here, for example, if degreasing is carried out in a nitrogen atmosphere, nitrogen is sealed in the sealed first spaces 23. Further, sometimes a few days are needed from the start of degreasing to the firing. If nitrogen or another inert gas is sealed in the sealed first spaces 23, the probability of oxidation of the connection portions 16 etc. is lowered in this period as well.

At step ST5, a green base body 13 (stacked assembly of ceramic green sheets) is fired.

At step ST6, through-holes (second openings) forming the second spaces 25 are formed in the third insulation layer 19C in the base body 13 after firing (FIG. 6A). The method of formation of the through-holes may be made the same as various known methods. For example, use may be made of machining and/or laser. In FIG. 6A, a mode in which the machining is carried out by a cutting tool 31 (for example a drill) is illustrated.

After that, although not particularly shown, the terminals 17 are inserted into the spaces 21 and are joined with the connection portions 16. Further, the sealing material 29 is placed.

The method of formation of the through-holes forming the second spaces 25 may be a different type from the method of formation of the through-holes forming the first spaces 23 or may be the same type. For example, as the former example, a mode forming the first spaces 23 by punching or laser and forming the second spaces 25 by machining may be mentioned. As the latter example, a mode forming both of the first spaces 23 and the second spaces 25 by machining may be mentioned. Further, when using the same types of methods, the specific machining conditions may be different between the first spaces 23 and the second spaces 25 or may be the same. As specific machining conditions, for example, when using a cutting tool, there can be mentioned the shape and dimensions of the cutting tool and also the rotational speed of the cutting tool and the feed speed of the cutting tool.

When the method of formation of the through-holes forming the first spaces 23 and the method of formation of the through-holes forming the second spaces 25 are different in their types or specific machining conditions, sometimes a difference of the condition of the surface can be observed between the first spaces 23 and the second spaces 25 in the wall surfaces of the spaces 21. For example, in a mode where the first spaces 23 are formed by punching or laser and the second spaces 25 is formed by a cutting tool 31, cutting marks (for example drill marks) can be observed in only the wall surfaces of the second spaces 25.

Figure 6B:
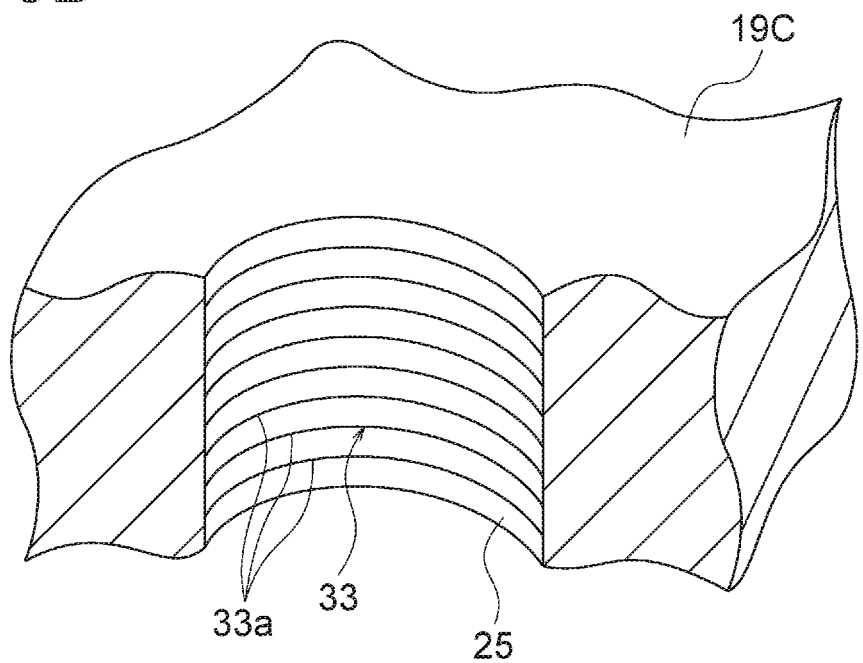
FIG. 6B is a partially enlarged perspective view in FIG. 6A.

FIG. 6B is a perspective view schematically showing the wall surface of a second space 25 in a case where the second spaces 25 are formed by the cutting tool 31 and schematically shows cutting marks 33. The cutting marks 33 are for example observed as stripe patterns configured by a plurality of grooves 33a extending around the axis of the cutting tool (around the center line vertically passing through the second space 25).

As explained above, in the present embodiment, the ceramic structure (heater 1) has the base body 13 and the internal conductor 14. The base body 13 is made of ceramic and has a first surface (lower surface 13b). The internal conductor 14 is positioned inside the base body 13 and has the connection portions 16. The base body 13 has the spaces 21 extending from the connection portions 16 to the lower surface 13b. The spaces 21 have the first spaces 23 and second spaces 25. The first spaces 23 contact the connection portions 16. The second spaces 25 connect the first spaces 23 and the outer side of the lower surface 13b and are smaller than the first spaces 23 in a planar perspective of the lower surface 13b.

Accordingly, for example, the areas by which the connection portions 16 are exposed in the spaces 21 can be made larger. As a result, for example, the bonding areas of the bonding material 27 for bonding the terminals 17 and the connection portions 16 relative to the connection portions 16 can be made larger. On the other hand, the diameters of the second spaces 25 are made smaller, therefore the reliability of sealing of the spaces 21 can be improved. As a result, for example, the connection portions 16 are easily protected from oxidation. Further, for example, in a case where the spaces 21 are made a vacuum or gas is enclosed in the spaces 21, the spaces 21 function as heat insulation portions. As a result, for example, the heat of the resistance heating element 15 becomes harder to be transferred to the lower surface 13b and becomes easier to be transferred to the upper surface 13a through the base body 13. Further, this effect is improved by the first spaces 23 being made relatively larger in a planar perspective.

Further, from another viewpoint, in the present embodiment, the ceramic structure (heater 1) has the base body 13 and the internal conductor 14. The base body 13 is made of ceramic and has a first surface (lower surface 13b). The internal conductor 14 is positioned inside the base body 13 and has the connection portions 16. The base body 13 has the spaces 21 extending from the connection portions 16 to the lower surface 13b. The wall surfaces of the spaces 21 have first regions (wall surfaces of the first spaces 23) and second regions (wall surfaces of the second spaces 25). The second regions are positioned on the lower surface 13b sides relative to the first regions and are different in condition of the surfaces from the first regions.

Accordingly, for example, the difference of the condition of the surfaces can be utilized. For example, in a case where the cutting marks 33 are formed on the inner walls of the second spaces 25, the bonding strength of the sealing material 29 with respect to the wall surfaces of the second spaces 25 is improved by the relief shapes formed by the cutting marks 33. Further, the cutting marks 33 are configured by a plurality of grooves 33a crossing the direction from the lower surface 13b of the base body 13 to the connection portions 16. Accordingly, in the interface between the wall surfaces of the second spaces 25 and the sealing material 29, the route from the outside of the lower surface 13b of the base body 13 up to the connection portions 16 becomes longer compared with a case where there are no cutting marks 33. As a result, the sealability of the spaces 21 is improved.

Further, in the present embodiment, the wall surfaces of the spaces 21 have steps 21a at the boundaries of the first spaces 23 and the second spaces 25.

In this case, for example, it is made easier to obtain the effect explained above by making the difference of diameters of the first spaces 23 and the second spaces 25 larger. Further, for example, by engagement of the sealing material 29 with respect to the third insulation layer 19C from the first space 23 sides, the strength of fixation of the sealing material 29 with respect to the base body 13 can be improved as well.

Further, in the present embodiment, each space 21 has only one second space 25.

In this case, for example, it is easy to make the second spaces 25 as large as possible within a range not more than the sizes of the first spaces 23. As a result, for example, placement of the terminals 17 in the first spaces 23 through the second spaces 25 is facilitated.

Further, in the present embodiment, the method for manufacturing the ceramic structure (heater 1) has the preparation process (step ST1), conductor placement process (step ST3), first opening forming process (step ST2), stacking process (step ST4), firing process (step ST5), and second opening forming process (step ST6). In the preparation process, one or more of each of the first to third ceramic green sheets (first insulation layer 19A to third insulation layer 19C before firing) are prepared. The first ceramic green sheet configures the first part (first insulation layer 19A) in the base body 13 which contacts the internal conductor 14 on the opposite side to the first surface (lower surface 13b). The second ceramic green sheet configures the second part (second insulation layer 19B) in the base body 13 which contacts the internal conductor 14 on the lower surface 13b side. The third ceramic green sheet configures the third part (third insulation layer 19C) in the base body 13 which contacts the second insulation layer 19B on the lower surface 13b side and has the lower surface 13b. In the conductor placement process, the material forming the internal conductor 14 is placed on the lower surface 13b side of the first ceramic green sheet (first insulation layer 19A before firing). In the first opening forming process, the first openings forming portions (first spaces 23) on the internal conductor 14 side in the spaces 21 are formed in the second ceramic green sheet (second insulation layer 19B before firing). In the stacking process, the first to third ceramic green sheets are stacked after the conductor placement process and first opening forming process to obtain the stacked assembly (base body 13 before firing). In the firing process, the stacked assembly is fired. In the second opening forming process, the second openings forming portions (second spaces 25) on the lower surface 13b side in the spaces 21 are formed in the regions overlapping the first spaces 23 in the third part (third insulation layer 19C) in the stacked assembly (base body 13) after firing.

Accordingly, for example, after firing the base body 13, work for forming the spaces 21 is carried out only on the third insulation layer 19C. Work on the second insulation layer 19B is unnecessary. As a result, for example, the probability of ending up damaging the connection portions 16 due to work for forming the spaces 21 at the base body 13 after firing is lowered. For example, the probability of the cutting tool 21 cutting the connection portions 16 is lowered. Here, it may be considered to form not only the first spaces 23, but also the second spaces 25 before stacking the ceramic green sheets. However, in this case, in the firing process etc., the connection portions 16 are exposed to the atmosphere at the external portion of the base body 13. As a result, for example, the connection portions 16 end up being oxidized, therefore the possibility arises of lowering the characteristics of the connection portions 16. On the other hand, in the manufacturing method of the present embodiment, the first spaces 23 are closed by the third insulation layer 19C until the second spaces 25 are formed after firing, therefore such a probability of oxidation is lowered. Further, when the second openings (second spaces 25) are formed in the third insulation layer 19C by the cutting tool 31, in the cutting tool 31, the front end side portion which passed through the third insulation layer 19C is positioned in the first spaces 23 and does not contact the base body 13. As a result, for example, impact which is given from the cutting tool 31 to the portion on the upper surface 13a side in the base body 13 is reduced. In turn, for example, the probability of occurrence of cracks on the upper surface 13a side in the base body 13 can be lowered. From another viewpoint, the thickness of the base body 13 from the internal conductor 14 to the upper surface 13a can be made smaller.

(Modifications)

Below, various modifications will be explained. In the explanations of modifications, basically, differences from the embodiment will be explained. The points which are not particularly referred to may for example be considered similar to the embodiment or may be deduced from the embodiment. Further, in the modifications, configurations corresponding to or similar to the configurations in the embodiment, even if there are points of difference, will for convenience sometimes be assigned the same notations. Further, in the following explanations, sometimes illustration of the terminals 17, bonding material 27, and sealing material 29 will be omitted.

(First Modification)

Figure 7A:
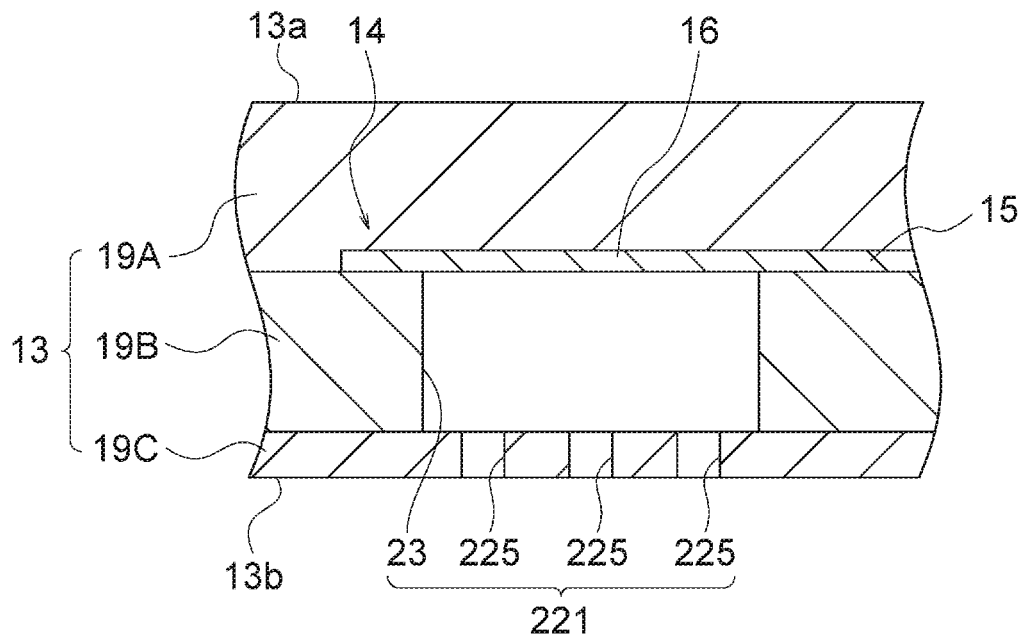
FIG. 7A and FIG. 7B are cross-sectional views showing portions in heaters according to first and second modifications.

FIG. 7A is a cross-sectional view showing a portion in a heater plate 209 according to a first modification. This cross-sectional view substantially corresponds to FIG. 3. However, as shown by the resistance heating element 15 extending to the right side on the drawing sheet, the cross-section along the long direction of the resistance heating element 15 is shown. However, the characteristic feature of the configuration shown in this view may appear as well in the cross-section in the same direction as FIG. 3.

In a space 221 in the heater plate 209, a plurality of second spaces 225 are provided with respect to one first space 23. In a planar perspective of the lower surface 13b of the base body 13, the sizes and arrangement of the plurality of second spaces 225 may be made suitable ones. For example, the plurality of second spaces 225 may be arranged in one row, may be arranged two-dimensionally, or may be located in a mode in which they cannot be grasped as being arranged.

According to such a mode, for example, it is easy to secure the strength of the third insulation layer 19C just under the first spaces 23. On the other hand, by securing wider first spaces 23, the effect by the first spaces 23 (for example heat insulation effect) can be improved. Further, for example, the resistance heating element 15 can be joined by arranging the plurality of second spaces 225 along the resistance heating element 15 as in the example shown and inserting the terminals 17 in the plurality of second spaces 225. In this case, in the resistance heating element 15 having an elongated shape, it is easy to secure the contact areas with the terminals 17. On the other hand, the lengths of the first spaces 23 and/or second spaces 225 in the width direction of the resistance heating element 15 are made shorter, whereby the strength of the base body 13 can be improved and the sealability of the spaces 221 can be improved.

(Second Modification)

Figure 7B:
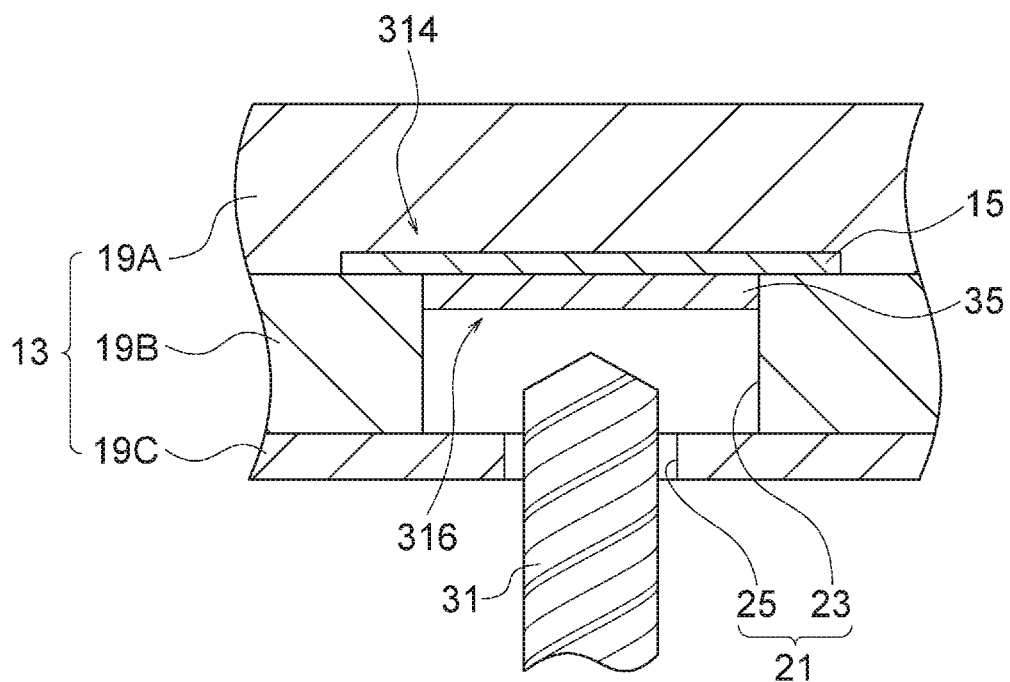

FIG. 7B is a cross-sectional view showing a portion in a heater plate 309 according to a second modification and corresponding to FIG. 3.

In this modification, an internal conductor 314 in the heater plate 309 has a conductor layer (resistance heating element 15 in the example shown) along the first surface (lower surface 13b of the base body 13) and a connection-use conductor 35 which is superimposed on the conductor layer on the lower surface 13b side. Further, by this connection-use conductor 35, a connection portion 316 joined to the terminal 17 is configured. Note that, the connection-use conductor alone may be grasped as the connection portion 316, or a combination of a portion of the resistance heating element 15 and the connection-use conductor may be grasped as the connection portion 316.

The position, thickness, size, etc. of the connection-use conductor 35 may be suitably set. For example, the connection-use conductor 35 may fall into the first space 23 (example shown) or may have a part which projects from the first space 23 and is positioned between the first insulation layer 19A and the second insulation layer 19B. Further, the connection-use conductor 35 may cover the entirety of the part in the resistance heating element 15 which overlaps the first space 23 in a planar perspective (example shown) or may cover a portion of it. The thickness of the connection-use conductor 35 may be thinner than, equal to, or thicker than (example shown) the thickness of the resistance heating element 15. The material of the connection-use conductor 35 may be the same as or may be different from the material of the resistance heating element 15. Further, the material may be one obtained by firing a conductive paste as well.

In the method for manufacturing the heater plate 309, the connection-use conductors 35 may be provided by a suitable method at a suitable timing so far as they are provided before closing the first spaces 23 by the third insulation layer 19C before firing. For example, a conductive paste forming the connection-use conductors 35 may be placed after placement of the conductive paste forming the resistance heating element 15 on the first ceramic green sheet forming the first insulation layer 19A and before superposition of the second ceramic green sheet forming the second insulation layer 19B on the first ceramic green sheet.

By providing such a connection-use conductor 35, for example, it is possible to realize a connection portion 316 comprised of a shape and material more suitable for bonding with the terminal 17 than a connection portion 16 comprised of part of the resistance heating element 15. Further, from a viewpoint of the manufacturing method, for example, when forming the second openings (second spaces 25) in the third insulation layer 19C after firing by the cutting tool 31, even if the cutting tool 31 ends up contacting the connection portions 316, the probability of cutting down to the resistance heating element 15 (main body of the internal conductor 314, conductor layer) is lowered.

(Third Modification)

Figure 8A:
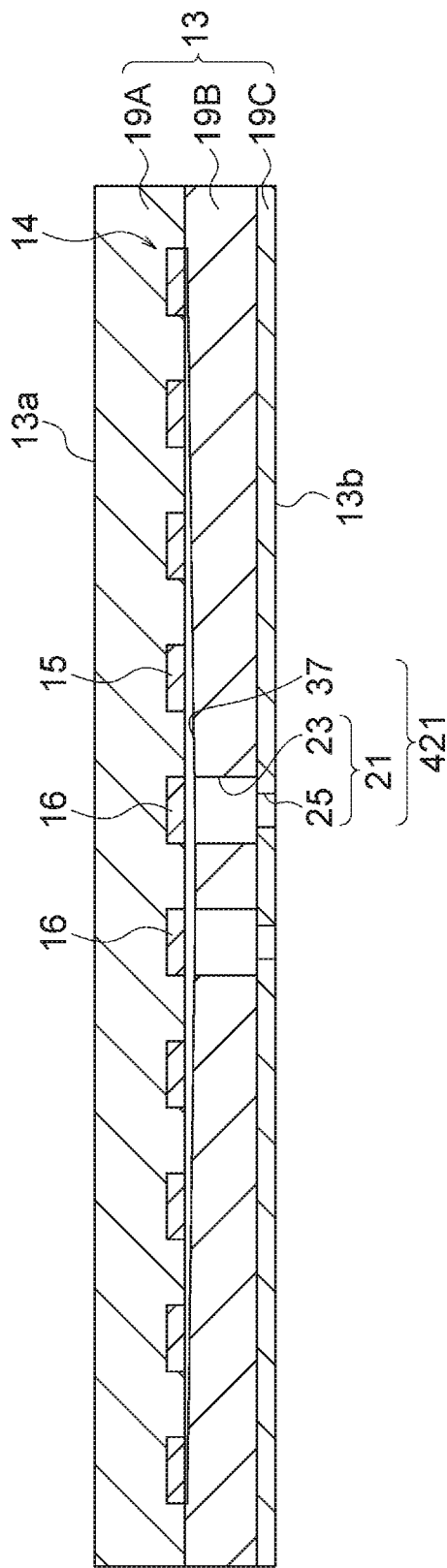
FIG. 8A and FIG. 8B are cross-sectional views showing portions in heaters according to third and fourth modifications.

FIG. 8A is a cross-sectional view showing a heater plate 409 according to a third modification and corresponding to the II-II line in FIG. 1 (cross-sectional view of the entirety of the heater plate).

In this modification, a space 421 has a layer-shaped space 37 in addition to the space 21 (main space) in the embodiment. The position, thickness, and size of the layer-shaped space 37 may be suitably set. For example, the thickness of the layer-shaped space 37 is made thinner than the thicknesses of the first space 23 and second space 25. The specific thickness thereof is for example 100 μm or less. The layer-shaped space 37, for example, has a part having a thickness not more than 100 μm as described above accounting for 50% or more, 80% or more, or the entirety of the area of the layer-shaped space 37.

The layer-shaped space 37 is for example formed between the first insulation layer 19A and the second insulation layer 19B. From another viewpoint, the layer-shaped space 37 contacts the internal conductor 14 (same as the resistance heating element 15 in the example shown) from the first surface (lower surface 13b of the base body 13) side. From still another viewpoint, the layer-shaped space 37 extends along the lower surface 13b from part of the thickness contacting the connection portions 16 in the thickness of the main space (space 21) in a direction perpendicular to the lower surface 13b (vertical direction).

In the vertical cross-section (cross-section perpendicular to the lower surface 13b) shown in FIG. 8A, the layer-shaped space 37 continues from one end to the other end. However, in another vertical cross-section, the layer-shaped space 37 may be divided by contact of the first insulation layer 19A and the second insulation layer 19B in part of the region where the layer-shaped space 37 is arranged. Further, due to division, a part which is not communicated with the space 21 may be formed in a portion of the layer-shaped space 37 (this part may be also grasped as a space different from the layer-shaped space 37 communicated with the space 21). Further, in the example shown, a plurality of main spaces (spaces 21) are communicated with each other by the layer-shaped space 37. However, such communication need not be carried out either.

The layer-shaped space 37 may extend with a suitable ratio over the region where the internal conductor 14 is arranged (in the example shown, the same as the region where the resistance heating element 15 is arranged). For example, in a planar perspective, the minimum circular shape or polygonal shape (for example rectangle) accommodating the internal conductor 14 is supposed. At this time, the layer-shaped space 37 may extend occupying 10% or more, 30% or more, 50% or more, 80% or more, or the entirety of the area of the circular shape or polygonal shape explained above. Note that, in the above explanation, the area of contact between the first insulation layer 19A and the second insulation layer 19B in the region where the layer-shaped space 37 is arranged may be excluded or may not be excluded from the area of the layer-shaped space 37. Further, the layer-shaped space 37 may extend up to the outer side of the circular shape or polygonal shape explained above.

The method for forming the layer-shaped space 37 may be made a suitable method. For example, the layer-shaped space 37 may be formed by suitably setting the conditions when firing the stacked assembly of the ceramic green sheets, and utilizing the contraction accompanying the firing of the ceramic green sheets to cause a clearance to be formed between the first insulation layer 19A and the second insulation layer 19B. Further, for example, by placing relatively fine spacers between the first insulation layer 19A and the second insulation layer 19B at the time of stacking the ceramic green sheets, the layer-shaped space 37 may be formed from the time before firing or a clearance due to contraction at the time of firing may be facilitated.

If providing the layer-shaped space 37 as in the present modification, for example, the melted state bonding material 27 (see FIG. 3) enters into the layer-shaped space 37 and the hardened state bonding material 27 engages with the surface of the second insulation layer 19B on the first insulation layer 19A side. Due to this, the probability of peel-off of the bonding material 27 from the connection portion 16 is lowered. In turn, the reliability of connection between the terminal 17 and the connection portion 16 is improved.

Further, for example, in a case where 80% or more or all of the volume of the space 421 or layer-shaped space 37 is made a vacuum or a gas is present (for example sealed) in 80% or more or all of the volume of the space 421 or layer-shaped space 37, the layer-shaped space 37 functions as a heat insulation layer. As a result, heat which escapes from the resistance heating element 15 to the lower surface 13b side of the base body 13 is reduced and thus heat can be made easier to be transferred to the upper surface 13a of the base body 13. Further, compared with a case where the area in a planar perspective of the main space (space 21) is made large, the volume of the base body 13 is secured, therefore this is advantageous for securing the strength and/or increasing the heat capacity of the heater plate 409.

(Fourth Modification)

Figure 8B:
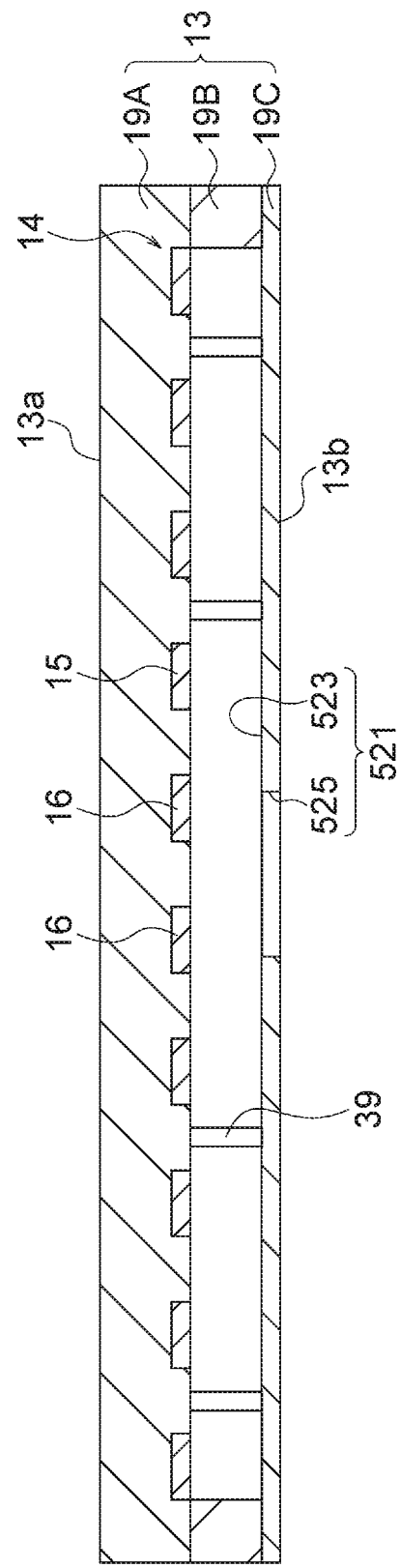

FIG. 8B is a cross-sectional view which shows a heater plate 509 according to a fourth modification and is similar to FIG. 8A.

In the third modification, it was stated that the space 421 may extend over a relatively broad range (for example 80% or more) of the region where the internal conductor 14 was arranged in a planar perspective of the first surface (lower surface 13b of the base body 13). Such a mode may be realized by a first space 523 as shown in the fourth modification as well.

Further, in the example shown, spacers 39 are provided between the first insulation layer 19A and the third insulation layer 19C. The spacers 39 for example contribute to securing the strength of the base body 13. The spacers 39 may be portions of the second insulation layer 19B or may be configured by different materials from that of the second insulation layer 19B. The spacers 39 may be for example column-shaped or may be wall-shaped. The wall-shaped spacers 39 may partition the space between the first insulation layer 19A and the third insulation layer 19C into a plurality of sections and thereby form spaces isolated from the first spaces 523 for exposing the connection portions 16. Naturally, such spacers 39 need not be provided either.

Further, the fourth modification also becomes an example where one first space 523 contacts a plurality of connection portions 16 (overlaps them in a planar perspective). In a case where one first space 523 overlaps a plurality of connection portions 16 in this way, the second space 525 may overlap the plurality of connection portions 16 (example shown) or a plurality of second spaces may individually overlap the plurality of connection portions 16.

(Fifth Modification)

Figure 9A:
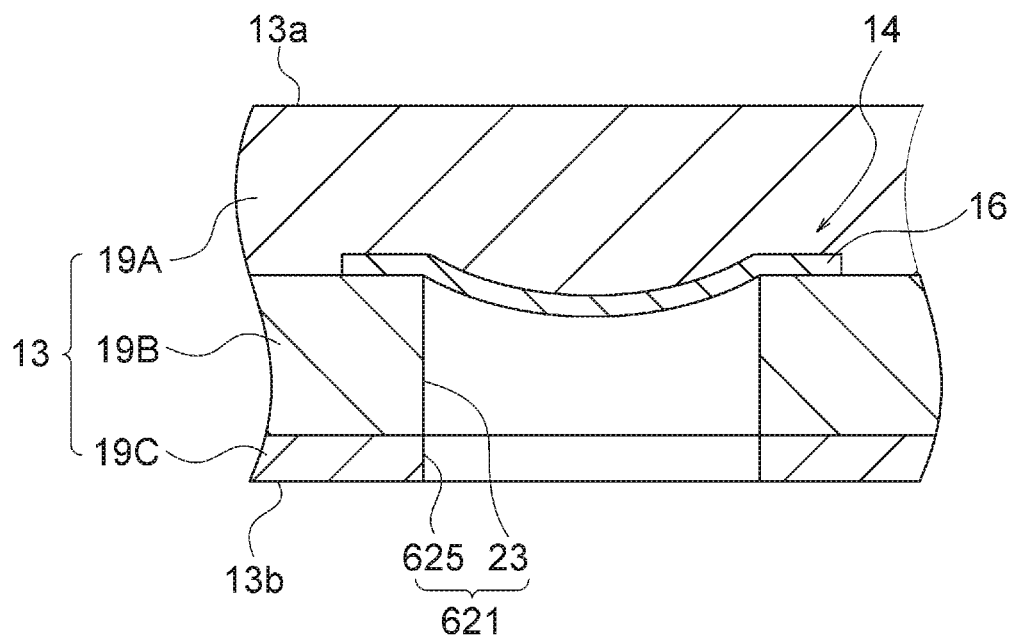
FIG. 9A is a cross-sectional view showing a portion in a heater according to a fifth modification.
Figure 9B:
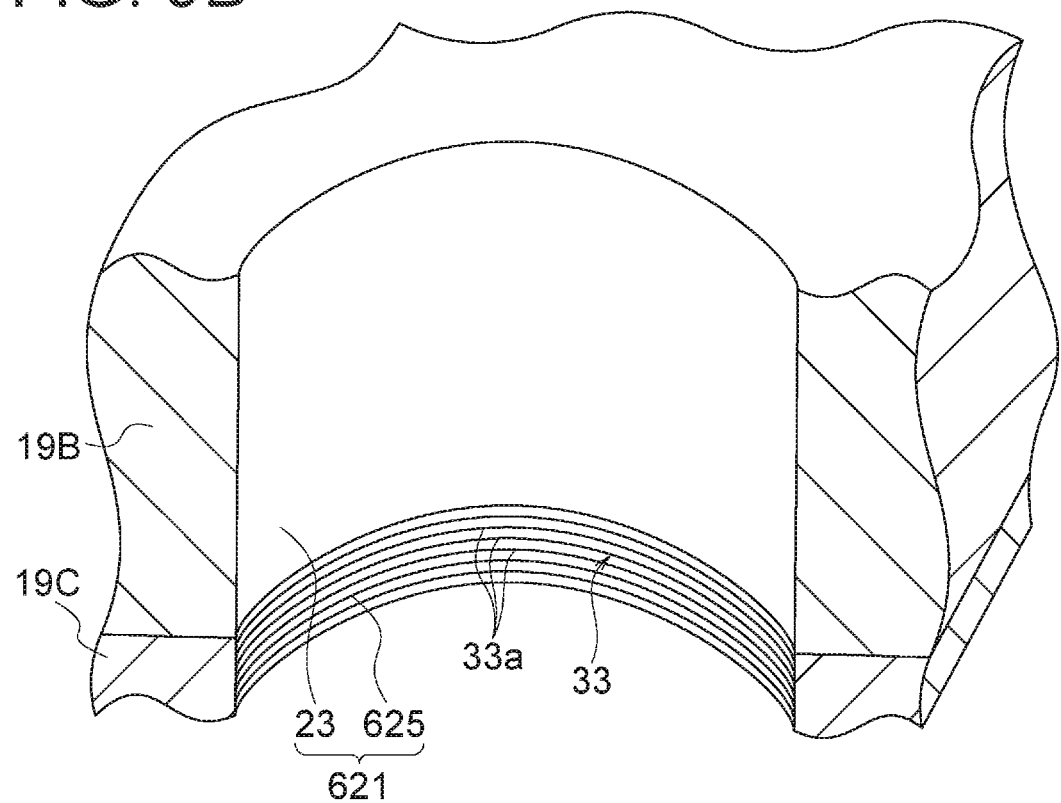
FIG. 9B is a partially enlarged perspective view in FIG. 9A.

FIG. 9A is a cross-sectional view showing a heater plate 609 according to a fifth modification and corresponding to FIG. 3. Further, FIG. 9B is a schematic perspective view showing the condition of the wall surface of a space 621 in the heater plate 609.

In this modification, in a planar perspective, the shape and size of the second space 625 are made the same as the shape and size of the first space 23. In other words, the wall surface of the space 621 does not have steps 21a (FIG. 3), but continues from the position of the connection portion 16 (position of the upper surface of the second insulation layer 19B) to the lower surface 13b of the base body 13. The heater plate 609 according to such a modification is for example prepared by the manufacturing method in the embodiment. However, in the second opening forming process, the second openings (second spaces 625) are formed so that their shapes and sizes become equal to the shapes and sizes of the first openings (first spaces 23).

By forming the first spaces 23 (first openings) before firing and forming the second spaces 625 (second openings) after firing, in the heater plate 609, sometimes characteristic features different from a case where the entireties of the spaces 621 are formed after firing appear.

For example, although depending on the conditions of the stacking process and firing process, as shown in FIG. 9A, the internal conductor 14 (from another viewpoint, the lower surface of the first insulation layer 19A) flexes in the parts overlapping the spaces 621 (first spaces 23) to the first surface (lower surface 13b of the base body 13) side. The degree of flexing is for example large enough to be visible in an image of a cross-section of a connection portion 16. Further, for example, in the range overlapping the first space 23, a difference between the highest position and the lowest position of the internal conductor 14 is 0.5 time or more, 1 time or more, 2 times or more, or 5 times or more of the thickness of the internal conductor 14. The shape of the flexing part in the internal conductor 14 may be made a suitable one. For example, it may be curved as a whole (example shown) or part or all may be linearly formed.

Further, for example, as explained also in the explanation of the embodiment, sometimes the wall surfaces of the first spaces 23 (first regions) and the wall surfaces of the second spaces 625 (second regions) are different in condition. In FIG. 9B, a mode where cutting marks 33 are formed only on the wall surface of the second space 625 is illustrated. Note that, as understood from this fact, when referring to "the wall surface of the space continues" (without having steps), very small irregularities (steps) such as cutting marks 33 which are not intended are ignored.

As explained above, in the present modification, the ceramic structure (heater plate 609) has the base body 13 and internal conductor 14. The base body 13 is made of ceramic and has the first surface (lower surface 13b). The internal conductor 14 is positioned inside the base body 13 and has the connection portions 16. The base body 13 has the spaces 621 extending from the connection portions 16 to the lower surface 13b. The internal conductor 14 has the conductor layer (for example resistance heating element 15) which extends along the lower surface 13b over the spaces 621 and their outer sides. The resistance heating element 15 flexes in the parts overlapping the spaces 621 to the lower surface 13b side.

Accordingly, for example, compared with the mode where the connection portions 16 are recessed to the lower surface 13b side (such a mode may also be included in the art according to the present disclosure), the probability of bubbles surrounded by the bonding material 27 being formed between the connection portions 16 and the terminals 17 and the areas of conduction being reduced is lowered. Further, for example, the volume of the base body 13 on the side closer to the upper surface 13a from the internal conductor 14 is made somewhat larger so heat storage on the upper surface 13a side can be improved. Further, for example, at the time when stress is generated between the terminals 17 (from another viewpoint, bonding material 27) and the connection portions 16 due to a difference in thermal expansion between the base body 13 and the terminals 17, easing of the stress due to elastic deformation of the connection portion 16 can be expected.

Further, in the present modification, the wall surfaces of the spaces 621 continue from the positions of the connection portions 16 to the first surface (lower surface 13b of the base body 13). From another viewpoint, the first spaces 23 and the second spaces 625 coincide when viewed on a plane.

In this case, for example, the second spaces 625 are formed relatively large, therefore placement of the terminals 17 in the first spaces 23 and bonding of the terminals 17 and the connection portions 16 and the like are easy.

(Sixth Modification)

Figure 10A:
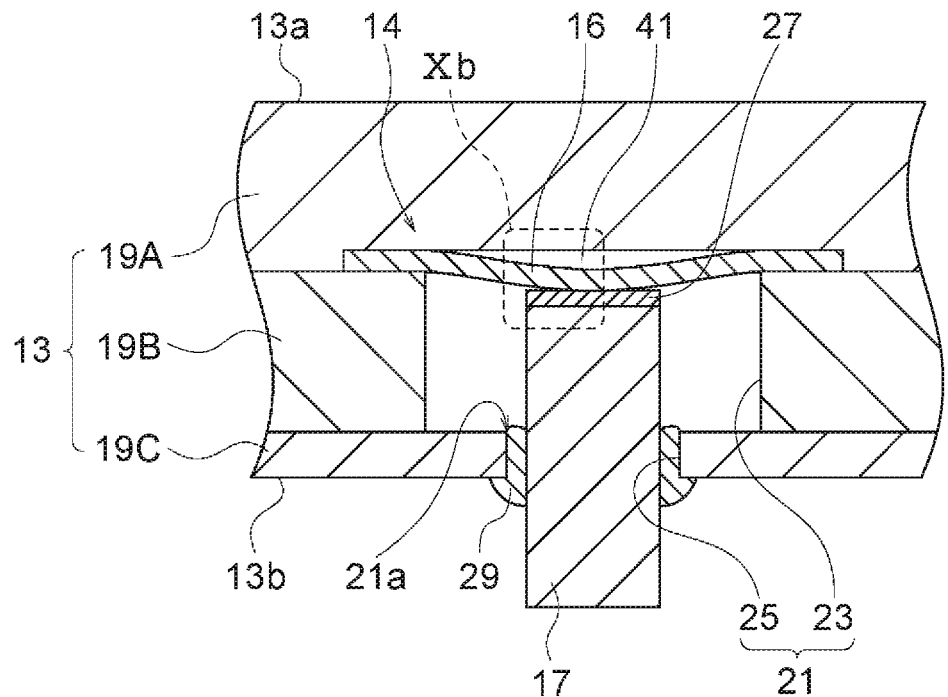
FIG. 10A is a cross-sectional view showing a portion in a heater according to a sixth modification.
Figure 10B:
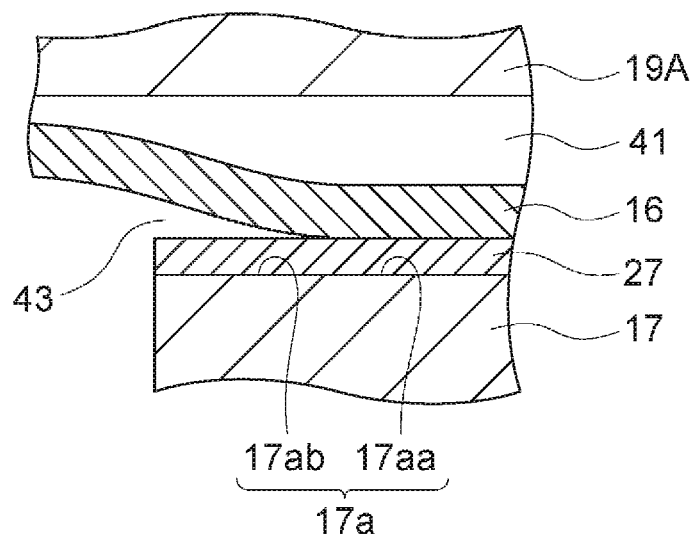
FIG. 10B is an enlarged view of a region Xb in FIG. 10A.

FIG. 10A is a cross-sectional view showing a heater plate 709 according to a sixth modification and corresponding to FIG. 3. Further, FIG. 10B is an enlarged view of a region Xb in FIG. 10A.

The internal conductor 14 (in more detail, for example the connection portion 16) flexes to the side of the lower surface 13b of the base body 13 in the same way as the fifth modification. Further, in the present modification, unlike the fifth modification, a clearance 41 is configured between the internal conductor 14 and the base body 13. The clearance 41 may be evacuated or there may contain a gas. Further, the clearance 41 may be communicated with or may not be communicated with the space 21.

The shape of the clearance 41 may be suitably set. In the example shown, the clearance 41 is configured by the plane-shaped lower surface of the first insulation layer 19A and the downward flexing upper surface of the internal conductor 14. In turn, when viewed in a cross-section, the clearance 41 substantially has a shape configured by a plane and an arc. However, unlike the example shown, for example, the clearance 41 may be formed by the two of the lower surface of the first insulation layer 19A and the upper surface of the internal conductor 14 curved downward and making the latter flex larger. Further, the lower surface of the clearance 41 (upper surface of the internal conductor 14) may include a flat portion as well. The shape of the clearance 41 when viewed on a plane may be any shape.

The size etc. of the clearance 41 may be suitably set as well. For example, the explanation of the degree of flexing of the internal conductor 14 in the fifth modification may be employed for the internal conductor 14 in the present modification. Further, for example, the thickness (vertical direction) of the clearance 41 is a size large enough to be visible in an image of the cross-section of the connection portion 16. Further, for example, the maximum thickness of the clearance 41 may be made 0.1 time or more, 0.5 time or more, 1 time or more, 2 times or more, or 5 times or more of the thickness of the connection portion 16. When viewed on a plane, the clearance 41 may be broader than the upper end surface 17a of the terminal 17 (example shown), may be equal to, or may be narrower than the latter.

The clearance 41 may be formed according to a suitable method. For example, in the same manufacturing method as the first embodiment, if various conditions of the conductor placement process, stacking process, and/or firing process are suitably set, the internal conductor 14 separates from the lower surface of the first insulation layer 19A while flexing into the space 21. Due to this, the clearance 41 is formed. Further, in the lower surface of the first insulation layer 19A before firing, a resin may be placed in a region which is scheduled to overlap the first spaces 23, and the material forming the internal conductor 14 may be placed on that. In this case, the clearance 41 is formed by consumption of the resin in the firing process.

Further, in the present modification, the upper end surface 17a of the terminal 17 is joined only in part with the connection portion 16. That is, the upper end surface 17a has a joined area 17aa joined to the connection portion 16 and a non-joined area 17ab which is not joined to the connection portion 16. The non-joined area 17ab for example faces the connection portion 16 across a clearance 43 (and bonding material 27).

The positions of the joined area 17aa and non-joined area 17ab on the upper end surface 17a may be suitably set. However, for example, the non-joined area 17ab (from another viewpoint, the clearance 43) is set so as to reach the outer edge of the upper end surface 17a from the joined area 17aa. In this case, the clearance 43 is communicated with the space 21.

In the example shown, generally, the center of the upper end surface 17a faces the apex part of the connection portion 16 having a shape projecting to the lower surface 13b side and is joined to the connection portion 16. In turn, the joined area 17aa becomes the region at the center side in the upper end surface 17a, and the non-joined area 17ab becomes the region surrounding the joined area 17aa and/or regions positioned on the two sides of the joined area 17aa on a predetermined cross-section. However, unlike the example shown, for example, a region biased from the center side in the upper end surface 17a may face the apex part of the projecting shape of the connection portion 16 as well. In turn, on a predetermined cross-section, the joined area 17aa may be positioned on one side in the horizontal direction, and the non-joined area 17ab may be positioned on the other side.

Further, also the sizes of the joined area 17aa and non-joined area 17ab (from another viewpoint, the clearance 43) may be suitably set. For example, the former may be broader than, equal to, or narrower than the latter. Also the thickness (vertical direction) of the clearance 43 may be suitably set. The thickness (vertical direction) of the clearance 43 is a size large enough to be visible in an image of the cross-section of the connection portion 16. Further, for example, the thickness of the clearance 43 may be made, at the maximum, 0.1 time or more, 0.5 time or more, or 1 time or more of the thickness of the connection portion 16.

As explained above, in the present modification, the part (connection portion 16) of the conductor layer (internal conductor 14) which overlaps the space 21 flexes to the first surface (lower surface 13b) side and, in addition, the clearance 41 is positioned between the base body 13 and the connection portion 16.

In this case, for example, the difference in thermal expansion between the terminal 17 and the base body 13 can be absorbed by the elastic deformation of the connection portion 16. As a result, for example, the heat stress generated between the terminal 17 (from another viewpoint, bonding material 27) and the connection portion 16 is reduced, therefore the probability of occurrence of peeling between the two can be lowered. Further, for example, by reducing the heat stress generated between the terminal 17 and the base body 13, the probability of occurrence of cracks in the base body 13 can be lowered.

Further, in the present modification, the upper end surface 17a of the terminal 17 has the joined area 17aa which is joined to the connection portion 16 and the non-joined area 17ab which extends from the joined area 17aa up to the outer edge of the upper end surface 17a and faces the connection portion 16 across the clearance 43.

In this case, for example, the difference in thermal expansion between the terminal 17 and the base body 13 can be expected to be absorbed by deformation of the connection portion 16 causing the connection portion 16 and the non-joined area 17ab be approach and separate. As a result, for example, the probability of occurrence of peeling between the terminal 17 (from another viewpoint, bonding material 27) and the connection portion 16 can be lowered.

Note that, in the above embodiment or modifications, the heater 1 and the heater plates 9, 209, 309, 409, 509, 609, and 709 are examples of the ceramic structure. The lower surface 13*b* of the base body 13 is an example of the first surface. The resistance heating element 15 is an example of the conductor layer. The wall surfaces of the first spaces 23 and 523 are examples of the first region. The wall surfaces of the second spaces 25, 225, 525, and 625 are examples of the second region. The spaces 21, 221, and 621 are examples of the main space. The first insulation layer 19A is an example of the first portion. The second insulation layer 19B is an example of the second portion. The third insulation layer 19C is an example of the third portion. The first insulation layer 19A, before firing is an example of the first ceramic green sheet. The second insulation layer 19B before firing is an example of the second ceramic green sheet. The third insulation layer 19C before firing is an example of the third ceramic green sheet. The first spaces 23 and 523 are examples of the first opening. The second spaces 25, 525 and 625 are examples of the second opening.

The heater according to the present disclosure is not limited to the above embodiment and modifications and may be worked in various ways.

The above embodiment and the various modifications may be suitably combined. For example, the connection-use conductor 35 in FIG. 7B may be combined with various modifications. Further, for example, the layer-shaped space 37 in FIG. 8A may be combined with a configuration such as shown in FIG. 9A where the first space 23 and the second space 625 coincide in a planar perspective.

In the embodiment, as the ceramic structure, a heater plate having a heating function was taken as an example. However, the ceramic structure may be one having another function as well. For example, the ceramic structure may be an electrostatic chuck or plasma generation-use electrode member or may be a structure functioning as a combination of two or more of them and the heater. Further, the ceramic structure is not limited to a structure for working a wafer (susceptor) and can be applied to all sorts of technical fields.

From another viewpoint, the internal conductor was a resistance heating element for heating in the embodiment, but may be a conductor for another purpose. For example, it may be an electrode for an electrostatic chuck or a plasma generation-use electrode. The ceramic structure may have a combination of one or two or more of these electrodes and resistance heating element. The internal conductor, for example, as a whole, may be formed as a conductor having a shape that extends along the upper surface of the base body (13) (faces the upper part). Further, for example, when assuming the minimum convex curve surrounding the entirety of the internal conductor when viewed on a plane, the region surrounded by the convex curve may account for 60% or more or 80% or more of the upper surface of the base body.

Further, part or all of the internal conductor need not be a conductor like a resistance heating element or electrode which directly handles the function of the ceramic structure either. For example, between the resistance heating element and/or electrode and the lower surface of the base body, a wiring layer for connecting the resistance heating element and/or electrode and the terminal may be provided. Further, the connection portion contacting the space may be configured by a portion of the wiring layer or a connection-use conductor which is superimposed on the above portion.

That is, the internal conductor may include a wiring layer.

As explained in the explanation of the embodiment, the manufacturing method according to the embodiment exhibits the effect that an impact which is given to the part in the base body on the opposite side to the first surface relative to the first space (upper surface 13*a* side in the embodiment) when forming the second opening (second space) can be mitigated. The electrostatic chuck is relatively small (for example 0.3 μm or less) in thickness from the electrode (internal conductor) inside the base body to the upper surface of the base body. Accordingly, in a case where the technique according to the present disclosure is applied to an electrostatic chuck as the ceramic structure, the above effect is effectively exhibited. The same is true for a case where the technique according to the present disclosure is applied to a focus ring built-in the electrode as the ceramic structure which is utilized for generation of plasma and the like. Further, a heat exchanger of the ceramic structure which includes a heater and heats a fluid or chemical composition sometimes has fine fins. The above effect is effectively exerted even in a case where the technique according to the present disclosure is applied to such a ceramic structure.

REFERENCE SIGNS LIST

1 . . . heater (ceramic structure), 13 . . . base body, 13*b* . . . lower surface (first surface), 14 . . . internal conductor, 15 . . . resistance heating element (conductor layer), 16 . . . connection portion, 21 . . . space, 23 . . . first space, and 25 . . . second space.

The invention claimed is:

1. A ceramic structure comprising:
   a base body which is made of ceramic and comprises a first surface; and
   an internal conductor which is located inside the base body and comprises a connection portion; and
   a terminal which is joined to the connection portion at an upper end surface of the terminal, wherein
   the base body comprises a space extending from the connection portion to the first surface,
   the internal conductor comprises a conductor layer which extends along the first surface over the space and an outer side of the space,
   the conductor layer having a second surface located on a side of the space and a third surface located on a side of the conductor layer opposite to the second surface and in contact with the base body,
   the conductor layer further comprises a part of the conductor layer overlapping the space, the part of the conductor layer including at least a portion of the second surface located on the side of the space and at least a portion of the third surface located on the side of the conductor layer opposite to the second surface,
   the at least a portion of the second surface and the at least a portion of the third surface of the part of the conductor layer flexing to a side closer to the first surface, and
   a bonding material is interposed between the part and the upper end surface.

2. The ceramic structure according to claim 1, wherein a clearance is located between the base body and the third surface.

3. The ceramic structure according to claim 1, wherein the upper end surface comprises
   a joined area which is joined to the connection portion, and a non-joined area which extends from the joined area up to an outer edge of the upper end surface and faces the connection portion across a clearance.

4. The ceramic structure according to claim 1, wherein a wall surface of the space continues from a position of the connection portion up to the first surface.

5. The ceramic structure according to claim 1, wherein the internal conductor has a substantially constant thickness.

6. The ceramic structure according to claim 1, wherein the internal conductor is made of a single material.

* * * * *